United States Patent
Kim et al.

(10) Patent No.: US 9,330,790 B2
(45) Date of Patent: May 3, 2016

(54) TEMPERATURE TRACKING TO MANAGE THRESHOLD VOLTAGES IN A MEMORY

(71) Applicant: Seagate Technology LLC, Cupertino, CA (US)

(72) Inventors: Young Pil Kim, Eden Prairie, MN (US); Rodney Virgil Bowman, Bloomington, MN (US); Caitlin Marie Race, Eagan, MN (US); Don R. Bloyer, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/261,560

(22) Filed: Apr. 25, 2014

(65) Prior Publication Data

US 2015/0310938 A1     Oct. 29, 2015

(51) Int. Cl.
| | |
|---|---|
| *G11C 16/04* | (2006.01) |
| *G11C 29/50* | (2006.01) |
| *G11C 7/04* | (2006.01) |
| *G11C 16/34* | (2006.01) |
| *G11C 29/02* | (2006.01) |
| *G11C 29/42* | (2006.01) |

(52) U.S. Cl.
CPC ............ *G11C 29/50004* (2013.01); *G11C 7/04* (2013.01); *G11C 16/349* (2013.01); *G11C 29/028* (2013.01); *G11C 29/42* (2013.01)

(58) Field of Classification Search
CPC ...... G11C 16/10; G11C 11/5628; G11C 7/04; G11C 11/406
USPC ................................ 365/185.24, 185.33, 211
See application file for complete search history.

(56) References Cited

U.S. PATENT DOCUMENTS

| | | | |
|---|---|---|---|
| 7,184,313 | B2 | 2/2007 | Betser et al. |
| 7,313,044 | B2 | 12/2007 | Fuhrmann et al. |
| 7,436,724 | B2 | 10/2008 | Nandi |
| 7,742,353 | B2 | 6/2010 | Chen et al. |
| 8,111,556 | B2 | 2/2012 | Wang et al. |
| 8,351,288 | B2 | 1/2013 | Tsai et al. |
| 8,599,622 | B2 | 12/2013 | Kim et al. |
| 8,611,166 | B2 | 12/2013 | Shinozaki |
| 2008/0031066 | A1 | 2/2008 | Nandi |
| 2008/0158378 | A1 | 7/2008 | Lee |
| 2011/0185224 | A1 | 7/2011 | Tsai et al. |
| 2012/0224425 | A1* | 9/2012 | Fai et al. ............ 365/185.09 |
| 2012/0287711 | A1 | 11/2012 | Kim et al. |

OTHER PUBLICATIONS

Peter Desnoyers, "Empirical Evaluation of NAND Flash Memory Performance," HotStorage '09, 5 pgs., Big Sky, Montana.

(Continued)

*Primary Examiner* — Huan Hoang
(74) *Attorney, Agent, or Firm* — Hall Estill Attorneys at Law

(57) ABSTRACT

Method and apparatus for managing data in a memory, such as a flash memory array. In accordance with various embodiments, a first data access operation is conducted on a memory cell and a first temperature associated with the memory cell and associated with the first data access operation is measured. A second temperature associated with the memory cell is measured. At least one operational parameter is adjusted responsive to the first and second temperatures associated with the memory cell. A second data access operation is conducted on the memory cell using the adjusted operational parameter.

20 Claims, 6 Drawing Sheets

(56) References Cited

OTHER PUBLICATIONS

Peter Forstner, "MSP430 Flash Memory Characteristics," Application Report SLAA334A, Sep. 2006—Revised Apr. 2008, pp. 1-9, Texas Instruments Incorporated, US.

Marco Grossi, Massimo Lanzone and Bruno Ricco, "A Novel Algorithm for High-Throughput Programming of Multilevel Flash Memories," IEEE Trans. Electron Devices, May 2003, pp. 1290-1296, vol. 50, No. 5, IEEE.

Paolo Pavan, Roberto Bez, Piero Olivo and Enrico Zanoni, "Flash Memory Cells—An Overview," Proceedings of the IEEE, Aug. 1997, pp. 1248-1271, vol. 85, No. 8, IEEE.

Shi Weihua, Hong Zhiliang, Hu Chaohong and Kang Yong, "Temperature self-adaptive program algorithm on 65 nm MLC NOR flash memory," Journal of Semiconductors, Aug. 2009, pp. 1-4, vol. 30, No. 8, Chinese Institute of Electronics.

Qi Wu Guiqiang Dong and Tong Zhang, "Exploiting Heat-Accelerated Flash Memory Wear-Out Recovery to Enable Self-Healing SSDs," ECSE Department, 2009, 5 pgs., Rensselaer Polytechnic Institute (RPI), USA.

T. Tanzawa, T. Tanaka, S. Tamada, J. Kishimoto, S. Yamada, K. Kawai, T. Ichikawa, P. Chiang and F. Roohparvar, "A Temperature Compensation Word-Line Voltage Generator for Multi-Level Cell NAND Flash Memories," 2010, pp. 106-109, IEEE.

* cited by examiner

TEMPERATURE TRACKING TO MANAGE THRESHOLD VOLTAGES IN A MEMORY

SUMMARY

Various embodiments disclosed herein are generally directed to the management of data in a memory, such as but not limited to a flash memory array.

In accordance with some embodiments, a first data access operation is conducted on a memory cell, and a first temperature associated with the memory cell is measured. A second temperature associated with the memory cell is subsequently measured. At least one operational parameter is adjusted responsive to the first and second temperatures associated with the memory cell. A second data access operation is conducted on the memory cell using the adjusted operational parameter.

In accordance with other embodiments, a method includes programming a memory cell to a selected programmed state, measuring a first temperature associated with the programming of the memory and storing a corresponding first temperature value in a memory. A second temperature associated with the non-volatile memory cell is subsequently measured responsive to a read command and a corresponding second temperature value is stored in a memory. A read operation is thereafter carried out responsive to the read command, the read operation comprising applying a read voltage threshold to the memory cell having a magnitude selected in relation to the first and second temperature values.

In accordance with further embodiments, an apparatus comprises a memory having a plurality of memory cells. A control circuit is adapted to perform a first data access operation on a memory cell and measure a first temperature associated with the memory cell in relation to the first data access operation. The control circuit subsequently measures a second temperature associated with the memory cell, adjusts at least one operational parameter responsive to the first and second temperatures, and perform a second data access operation on the memory cell using the adjusted at least one operational parameter.

These and other features and advantages which characterize various embodiments of the present disclosure can be understood in view of the following detailed discussion and the accompanying drawings.

DETAILED DESCRIPTION

Figure 1:
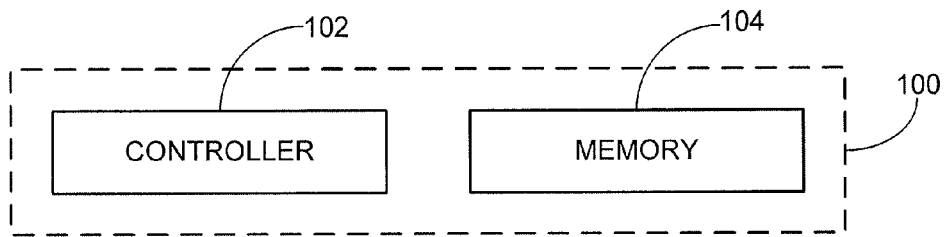
FIG. 1 provides a functional block representation of an exemplary data storage device in accordance with some embodiments.

The present disclosure generally relates to the management of data in a memory, such as but not limited to data stored in a flash memory array.

In a flash memory cell, a threshold voltage is the voltage at which a low-resistance channel is created where charge can flow from source to drain through the cell. The programmed logical state of the memory cell (e.g., 0, 1, 01, etc.) can be determined in relation to the magnitude of the threshold voltage required to place the cell in a conductive state.

Threshold voltages can vary widely at different temperatures in different types of memory devices. Generally, for a given design, flash memory cells tend to drive higher current at higher temperatures and lower current at lower temperatures for a given threshold voltage.

When performing a read operation on a programmed flash memory cell, a predicted threshold voltage can be used based on the then-existing temperature of the chip (e.g., substrate temperature), or ambient temperature adjacent the chip (e.g., ambient device temperature). In this way, compensation can be provided to account for variations in cell response due to the then-existing temperature.

This approach assumes, however, that the initial programming of the cell resulted in the accumulation of charge within a relatively tight tolerance range. It has been determined that the temperature of the flash memory cell during the programming operation can introduce significant variation in the actual amount of accumulated charge. This temperature-based write variation is in addition to other factors that can induce charge drift in the amount of accumulated charge in the cell, such as data retention aging, P/E (program/erase) counts, read/write disturbed data effects, etc.

Accordingly, various embodiments disclosed herein are generally directed to a method and apparatus for predicting and managing threshold voltages for a memory cell by monitoring temperatures of the memory cells during different types of access operations.

As explained below, various steps may be taken including performing a first data access operation on a memory cell, such as a programming (data write) operation, and measuring a first temperature associated with the first data access operation. Further, the method can include subsequently measuring a second temperature associated with the memory cell and performing a second data access operation on the memory cell, such as a data read operation, by adjusting at least one operational parameter in response to the measured first and second temperatures associated with the memory cell.

The operational parameter may take a variety of forms, such as but not limited to a read threshold voltage, a program/write threshold voltage, an erasure threshold voltage, etc. Monitoring the memory cell/chip temperature and actively compensating for the temperature affect on the memory cells, the number of bit errors in the life of the memory cell operation can be reduced and the lifetime of the memory cell will be enhanced.

These and other features and considerations will be discussed beginning with a review of FIG. 1, which generally illustrates an exemplary data storage device 100. The device 100 includes a controller 102 and a memory module 104. The controller 102 provides top level control for the device 100 and may be configured as a programmable processor with associated programming in local memory.

The memory module 104 can be arranged as one or more non-volatile memory elements such as rotatable recording discs or solid-state memory arrays. While a separate controller 102 is shown in FIG. 1, such is unnecessary as alternative embodiments may incorporate any requisite controller functions directly into the memory module.

While not limiting, for purposes of the present discussion it will be contemplated that the data storage device 100 is a solid-state drive (SSD) that utilizes NAND flash in the memory module 104 to provide a main data store for a host device (not shown). Other forms of solid-state memory can be used, including NOR flash, rewritable non-volatile memory cells such as spin-torque transfer random access memory (STRAM), resistive random access memory (RRAM), ferro-magnetic random access memory (FeRAM), programmable logic cells (PLCs), etc.

The host device can be any device that communicates with the storage device 100 such as but not limited to a desktop computer, a laptop, a server a network controller, a tablet, a smart phone, a network appliance, a gaming console, etc. For example and not by way of limitation, the storage device may be physically incorporated into the host device, or the host device may communicate with the host device via a network using any suitable protocol.

Figure 2:
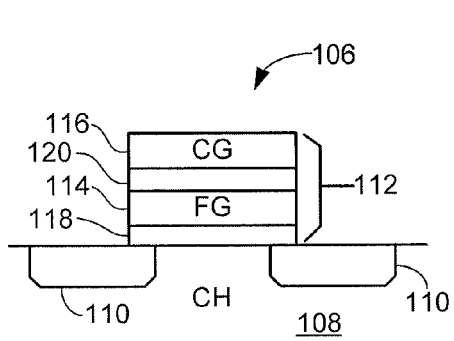
FIG. 2 shows a flash memory cell construction that can be used in the device of FIG. 1.

FIG. 2 illustrates an exemplary flash memory cell 106 that can be incorporated into the memory module 104 of FIG. 1. The memory cell 106 as shown in FIG. 2 is formed on a semiconductor substrate 108 having spaced apart n+ doped regions 110. A gate structure 112 spans the pair of adjacent doped regions so that the flash cell 106 takes a general nMOS transistor configuration. A series of adjacent flash cells can be formed in a NAND configuration with a gate structure 112 spanning each adjacent pair of doped regions 110.

Each gate structure 112 provides an alternating stack of electrically conductive gates 114, 116 and electrically insulative regions 118, 120. The gate 114 is referred to as a floating gate (FG) and the gate 116 is referred to as a control gate (CG) 116.

Data are stored by each cell 106 in relation to the relative amount of electrical charge stored on the floating gate 114. The floating gate 114 accumulates charge during a programming operation by the selected application of appropriate voltages to the adjacent doped (drain and source) regions 110 and the control gate 116. This induces a controlled migration of electrical charge from a channel (CH) portion of the semiconductor substrate 108 across the insulative region 118 to the floating gate 114.

Accumulated charge is subsequently removed from the floating gate 114 using an erasure operation. During erasure, appropriate voltages are applied to the regions 110 and the control gate 116 to induce migration of the accumulated charge from the floating gate 114, across the insulative region 118 to the channel CH.

In an initial erased state, there will be substantially no accumulated charge on the FG 114. In this state, the cell will exhibit drain-source conductivity across the channel CH without the application of any significant voltage to the control gate 116.

Once charge has been accumulated on the FG 114, however, the drain-source path will remain non-conductive unless a sufficiently high gate control voltage (or threshold voltage) is applied to the control gate 116, at which point the cell becomes conductive.

The programmed state of the cell 110 can thus be determined by observing the level of control gate voltage required to allow drain-source current to pass through the cell, which indicates the amount of accumulated charge on the floating gate 114. Different, discrete amounts of total accumulated charge can therefore be used to denote different programmed states.

The cells 106 can be configured as single-level cells (SLCs) or multi-level cell (MLCs). An SLC flash cell stores a single bit; a normal convention is to assign the logical bit value of 1 to an erased cell (substantially no accumulated charge) and a logical bit value of 0 to a programmed cell (presence of accumulated charge above a predefined level).

An MLC flash memory cell stores multiple bits, such as two bits. Generally, n bits can be stored using $2^n$ storage states. A normal convention is to assign the multi-bit logical value 11 to an erased cell with charge C0 (substantially no accumulated charge), and assign other multi-bit logical values (e.g., 10, 00 and 01) to increasingly higher charge levels C1, C2 and C3 where C0<C1<C2<C3.

Figure 3:
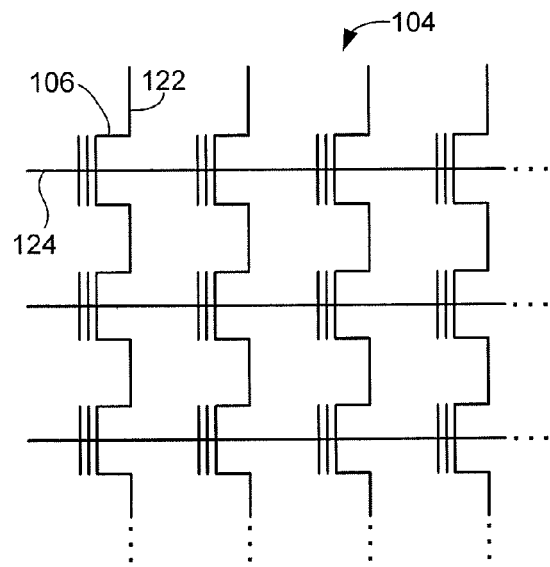
FIG. 3 is a schematic depiction of a portion of a flash memory array using the cells of FIG. 2.

The memory cells 106 can be arranged in the memory module 104 as an array of rows and columns, as generally depicted in FIG. 3. Each column of cells can be coupled via one or more bit lines (BL) 122. The control gates (CG) 116 of the cells 106 along each row can be interconnected via individual word lines (WL) 124. Various control circuits can be used to individually access the cells.

Figure 4:
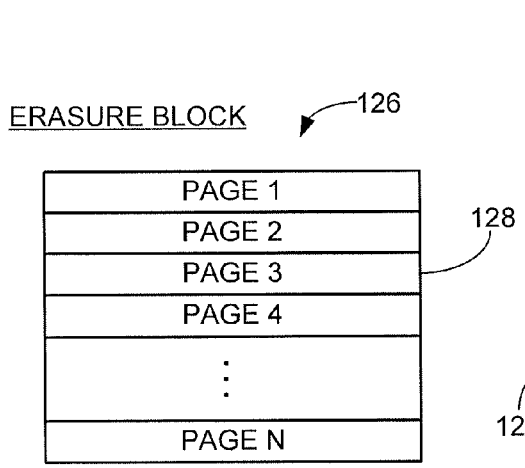
FIG. 4 illustrates a format for an erasure block.

The array of memory cells 106 shown in FIG. 3 may further be grouped into erasure blocks 126, as depicted in FIG. 4. Each erasure block 126 is a separately addressable block of memory and represents the smallest unit of memory that can be concurrent erased at a time. Each row of cells is referred to as a page 128, and each page is configured to store a selected amount of user data. In some cases, multiple pages of data may be stored to the same row of MLCs, with the most significant bit (MSB) indicating the data state of a first page of data and the least significant bit (LSB) indicating the data state of a second page of data.

Block-level wear leveling may be employed by the controller 102 to track the erase and write status of the various blocks 126. New blocks can be allocated for use as required to accommodate newly received data. Metadata and other control information to track the data may be stored in each erasure block 126, or stored elsewhere such as in specific blocks dedicated to this purpose.

Once data are written to as a particular page, it is usually required to erase those cells before new data may be written thereto. Data for a particular logical address (e.g., logical block address, or LBA) may be stored in a first page with a first physical address. Should the device 100 receive a write command to write new, updated data for that LBA, the controller 102 may select a second, new page with a different physical address to store the updated data, and may mark the LBA data in the first page as stale (older version) data. When all of the data in a page are superceded, the page may be marked for erasure. When enough pages in a given block are marked for erasure, a garbage collection (GC) operation may be scheduled in the background to migrate current version data to a new block and to erase the existing block.

Figure 5:
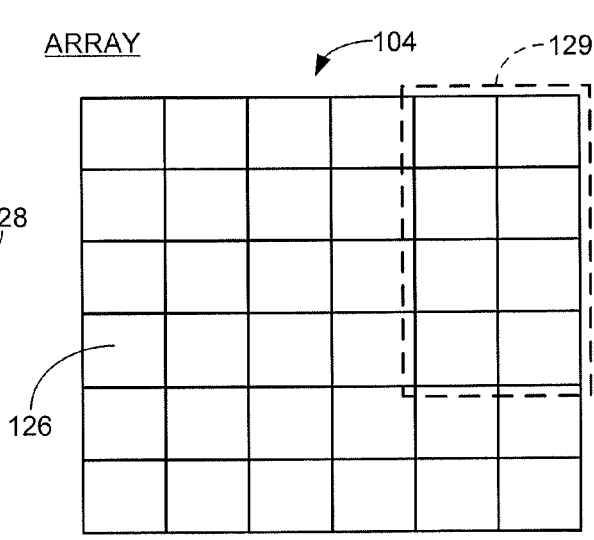
FIG. 5 is an exemplary arrangement of erasure blocks from FIG. 4.

FIG. 5 shows a portion of the memory array 104 as a grouping of erasure blocks 126 from FIG. 4. It is contemplated that the memory array 104 may include any number of such blocks, including blocks on different dies, strips, planes, chips, layers and arrays. Each of the erasure blocks 126 may be separately erasable and the controller 102 may track control information for each erasure block, such as a total number of erasures, date stamp information relating to when the various blocks have been allocated, etc. The controller may group multiple sets of the erasure blocks into larger, multi-block garbage collection units (GCUs) which are then allocated and erased as a unit. An example GCU is denoted at 129.

Figure 6:
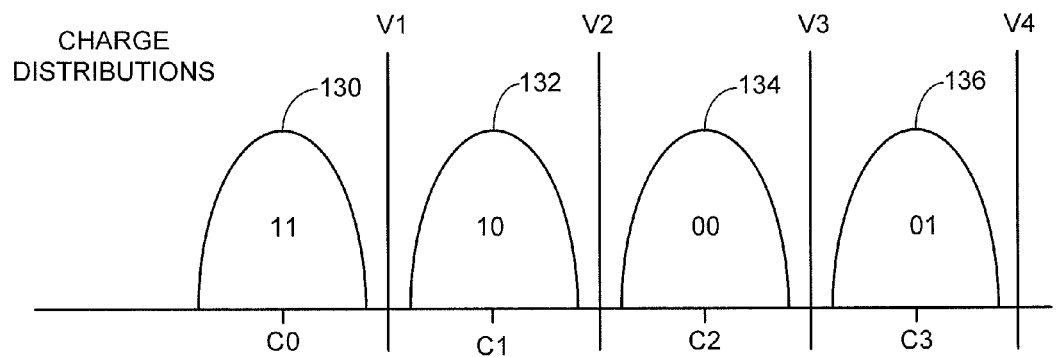
FIG. 6 shows charge distributions indicative of different data storage states for the flash memory cells in a flash memory array.

FIG. 6 shows a sequence of charge distributions 130, 132, 134 and 136. These distributions represent different groupings of memory cells 116 from FIGS. 3-5 that were stored with different charge levels during normal programming operations. Distribution 130 represents a first population of cells programmed to a first nominal charge level C0 (logical 11) state. Distribution 132 represents a second population of cells programmed to a second nominal charge level C1 (logical 10); distribution 134 represents a third population of cells programmed to a third nominal charge level C2 (logical 00); and distribution 136 represents a fourth population of cells programmed to a fourth nominal charge level C3 (logical 01). Other logical designations can be assigned to these distributions.

The populations are shown to be substantially Gaussian about the nominal charge levels $C0<C1<C2<C3$. The variations in charge level arise as a result of a variety of operational factors. For example, during programming a charge pump may be used to transfer discrete quanta of charge to the cells, and this process may result in slightly different total amounts of accumulated charge on individual cells programmed to the same state. Other contributing factors can including aging and manufacturing variations.

Normally, the distributions are sufficiently distinct such that intervening read sense voltages can be applied to differentiate between the respective distributions and identify the programmed state of a given cell. Four such read sense voltages are depicted in FIG. 6 as V1-V4 with $V1<V2<V3<V4$. By way of illustration, the application of read sense voltage V3 to the control gates of the various flash cells in FIG. 3 (via word lines 124) would tend to be sufficient to place those cells in the right-most distribution 136 into a conductive state, whereas the cells in the remaining distributions 130-134 would remain in a non-conductive state. The programmed state of any given cell can thus be quickly sensed by the application of one or more of the sense voltages V1-V4 in a sequential order.

Figure 7:
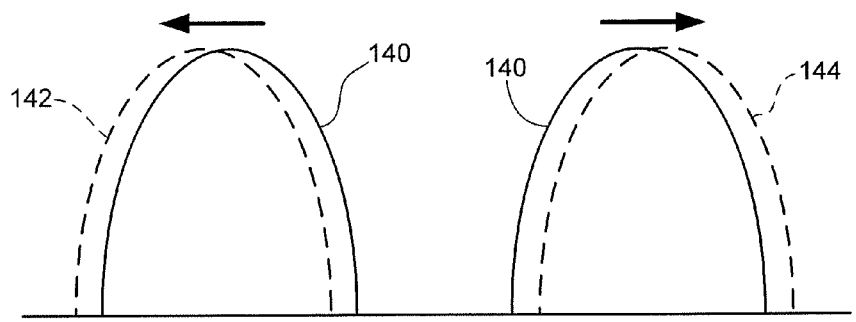
FIG. 7 illustrates exemplary changes in charge distribution that may arise through read disturbance of the data stored in a flash memory array.

FIG. 7 shows another charge distribution 140 to illustrate variations in accumulated charge as a result of changes in the ambient or chip temperature of a memory cell at the time of programming, writing or reading of the memory cell. In some cases, lower ambient or chip temperatures of the cells in the distribution 140 may result in a lower effective amount of accumulated charge, as indicated by shifted distribution 142. In other cases, higher ambient or chip temperatures of the memory cell at the time of programming, writing or reading the memory cell may cause increases in the amount of effective accumulated charge on the floating gates, as depicted by shifted distribution 144. As demonstrated by FIG. 7, temperature can have a significant effect upon the retention and sensing characteristics of the cells.

Depending on a variety of factors, it is contemplated that in at least some circumstances a given population of cells programmed to a given logical state may have some cells lose charge and others gain charge, resulting in a "spreading" of the distribution in both directions. The affect of the temperature of the memory cell at the time of various operations performed on the memory cell can lead to the phenomenon represented in FIG. 7 and can be exhibited by each of the different populations 130-136 in FIG. 6. Other factors that can introduce charge variation in a given population include data retention rates (e.g., data aging), the aging of the memory cells including accumulated P/E counts, the effects upon cells through programming operations (write disturb) and sensing operations (read disturb) on adjacent cells, etc.

Accordingly, various embodiments of the present disclosure generally operate to compensate for the temperature effects on the threshold voltage of a memory cell at the programming, reading and writing operations to reduce the number of bit errors in the life of a memory cell.

Figure 8:
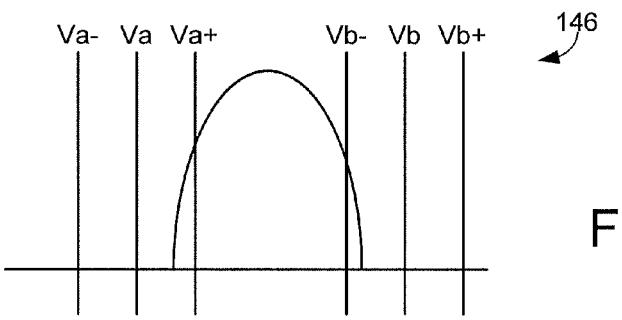
FIG. 8 illustrates application of different read voltage thresholds to evaluate the presence or absence of read disturbance effects in accordance with some embodiments.

FIG. 8 represents another exemplary population distribution 146 for a number of memory cells programmed to a selected programming state. The distribution 146 may correspond to any of the distributions 130-136, 140-144 discussed above. A first read threshold Va can be expected to render one or more of the cells in the distribution 146 conductive. Due to various factors, the appropriate threshold voltage can be an incremented threshold Va+ or a decremented threshold Va−. Based on the temperature of the memory cell during a previous data access operation and the temperature of the memory cell during a current data access operation, whether the appropriate threshold voltage is an incremented threshold Va+ or a decremented threshold Va− can be better determined.

Using the temperatures of the memory cell during the data access operations can provide an indication of the extent to which charge drift has been experienced by the cells. Thus, the appropriate threshold voltage can more accurately be predicted. This reduces the number of bit errors for the memory cell and enhances the life of the memory cell.

The distribution 146 also shows a second threshold Vb, incremented threshold Vb+ and decremented threshold Vb−. The second set of thresholds can be evaluated and predicted based on temperatures of memory cells similar to the threshold Va, incremented threshold Va+ and decremented threshold Va−.

Figure 9:
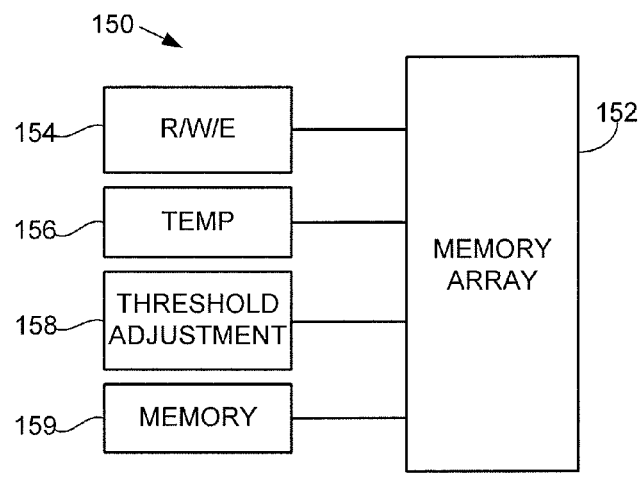
FIG. 9 depicts circuits of a storage device configured to compensate for read disturbed data in accordance with some embodiments.

FIG. 9 depicts portions of a data storage device 150 constructed and operated in accordance with some embodiments. The storage device 150 generally corresponds to the device 100 discussed above and includes a data storage memory 152, which may be a flash memory array as discussed above. Other components include a read/write/erase (R/W/E) channel 154, one or more temperature sensors 156, a voltage threshold adjustment circuit 158 and a local memory 159.

It will be appreciated that the components shown in FIG. 9 are merely exemplary and are not limiting, as a variety of other types of components may be incorporated as desired. The various components may be implemented via a programmable or hardware controller such as the controller 102 (see FIG. 1), or may be incorporated directly into the memory array.

Data transfers are carried out with the memory array 152 via the R/W/E channel 154. The local memory 159 may provide temporary data buffering as well as other functions such as the storage of metadata, etc.

Each time a data access operation is performed, such as a programming operation (writing operation), a read operation or an erasure operation, a temperature associated with the memory cell is measured by the temperature sensor 156 and stored in the local memory 159. The temperature can be any suitable temperature generally correlated to the memory cell (s) associated with the access operation, including a substrate temperature (see e.g., substrate 108 in FIG. 2), a chip package ambient temperature, an ambient temperature within the device 150, etc. In some cases, multiple temperature measurements are obtained and a final measurement is extrapolated therefrom.

The voltage threshold adjustment circuit 158 determines a suitable threshold voltage (such as a read threshold, a program verify voltage, an erasure voltage) for a current data access operation based on the temperature of the memory cell during a previous data access operation and the temperature of the memory cell during the current data access operation.

In one illustrative embodiment, a program operation is carried out responsive to a host write command to program a selected set of memory cells (such as data written to a selected page of memory 128, FIG. 3) with one or more blocks of user data. The temperature of the selected set of memory cells is measured by the temperature sensor(s) 156 and stored in memory 159. The voltage threshold adjustment circuit 158 selects appropriate voltage thresholds, such as program verify thresholds, based on the currently measured temperature for use during the programming operation.

The temperature measurements associated with the programming operation are thereafter retained, such as by being incorporated as a portion of the metadata associated with the programmed data. Thus for example, the updated metadata (with the temperature measurement(s)) may be transferred to a suitable location in the non-volatile flash array 152.

Continuing with the current example, a read command is subsequently received from the host to retrieve the previously programmed data. The R/W/E channel 152 executes a read operation in response thereto. As part of the read operation, the metadata associated with the requested data are retrieved to locate the selected set of memory cells storing the requested data. Included in the metadata is the previous temperature value associated with the previous programming operation.

Concurrently with this operation, one or more then-existing temperature measurements are obtained by the temperature sensor(s) 156 to provide a current temperature value for the memory cells. This current temperature value is stored in the memory 159. The voltage threshold adjustment circuit 158 thereafter selects an appropriate set of voltage thresholds, such as read voltage thresholds (see e.g., V1-V4 in FIG. 6), for use during the read operation. The read voltage thresholds are selected based on both the previous temperature value and the current temperature value.

Figure 10:
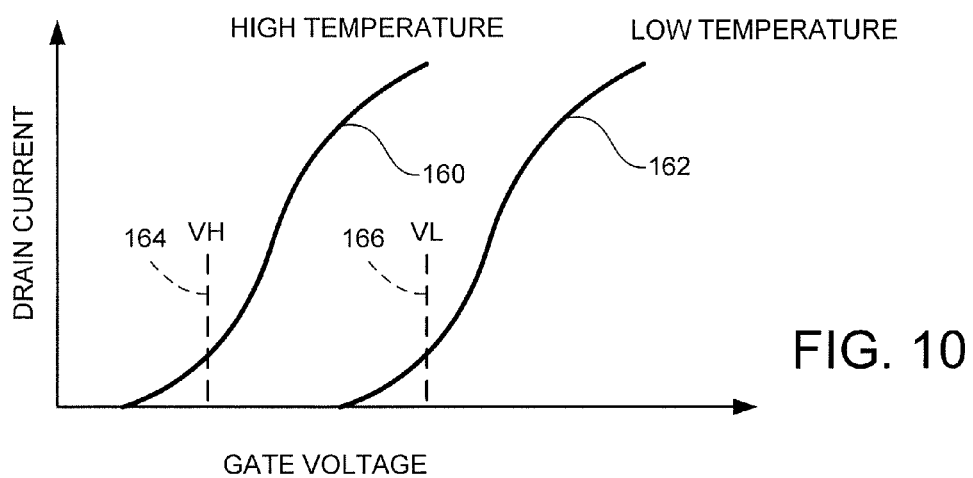
FIG. 10 depicts current-voltage curves for a memory cell as a function of temperature.

In some embodiments, the voltage threshold adjustment circuit uses a lookup table based on empirical measurements of performance versus temperature to select the appropriate voltage thresholds. FIG. 10 provides current-voltage curves for a memory cell as a function of temperature. A first current-voltage (I-V) curve 160 is shown for a selected memory cell at a lower temperature and a second current-voltage (I-V) curve 162 is shown for the same memory cell at a higher temperature. The I-V curves 160, 162 in FIG. 10 show that memory cells drive higher current at higher temperatures so that a threshold voltage VH (line 164) is lower than a threshold voltage VL (line 166).

Figure 11A:
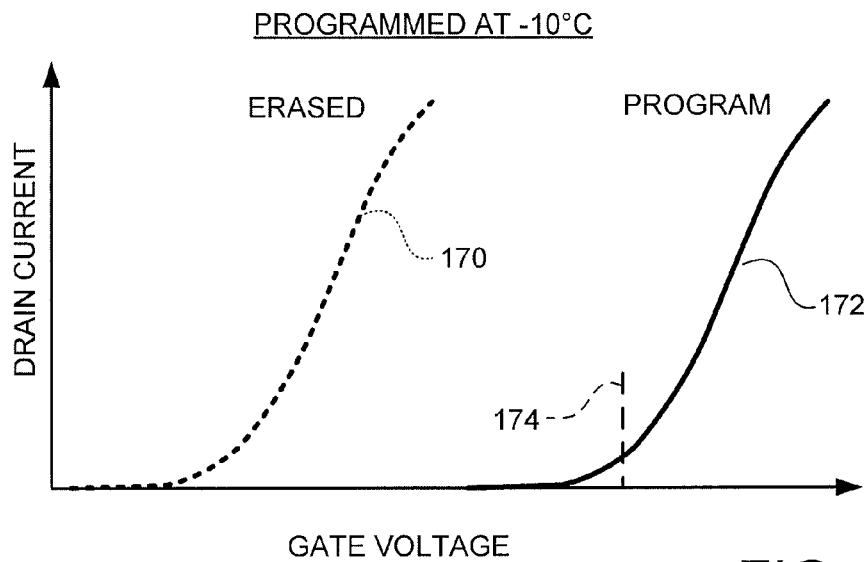
FIGS. 11A-11B provide current-voltage curves for the memory cell of FIG. 10 during a programming operation and a subsequent read operation.
Figure 11B:
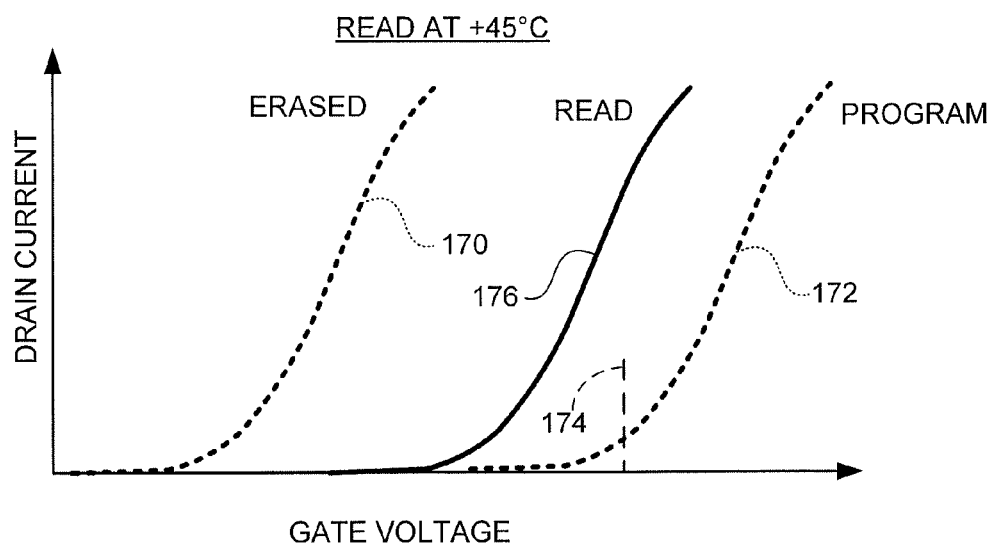

FIG. 11A illustrates a programming operation for the selected memory cell of FIG. 10 at a first lower temperature, such as −10° C., and FIG. 11B illustrates a subsequent read operation upon the cell at a second, higher temperature such as +45° C. I-V curve 170 represents the cell in an initial erased state, I-V curve 172 represents the programmed cell response at the first lower temperature, and threshold 174 denotes the target program verify threshold for the programming operation. At the programming temperature of −10° C., the threshold 174 was sufficient to indicate that the programming operation met the target value based on a certain number of stored electrons being migrated to the floating gate. However, as evidenced by I-V curve 176 in FIG. 11B, which represents the cell response at the higher +45° C. temperature, the accumulated charge is insufficient to indicate the correct programmed state during the subsequent read operation at the higher temperature.

Figure 12A:
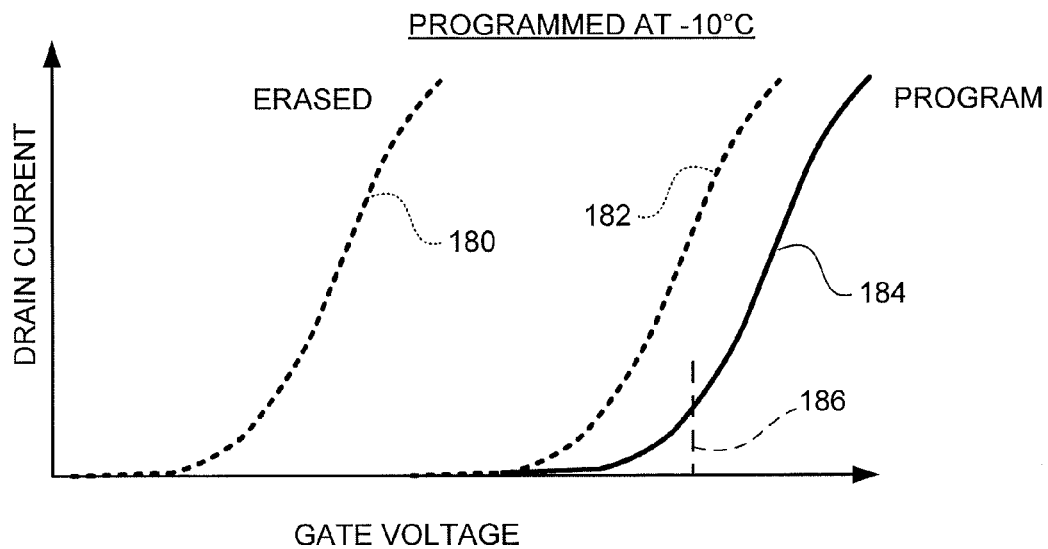
FIGS. 12A-12B provide corresponding current-voltage curves for the memory cell of FIG. 10 using adjusted operational parameters in accordance with some embodiments.
Figure 12B:
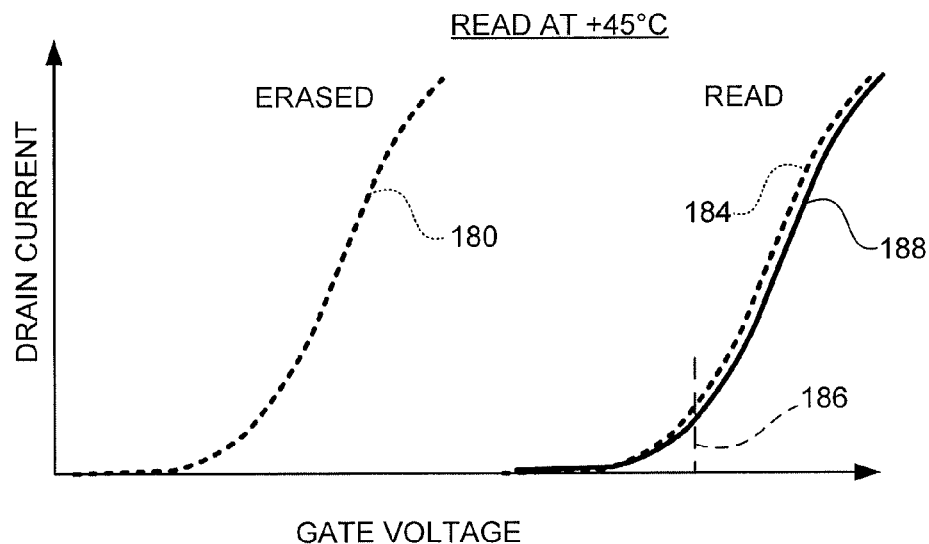

The device 150 of FIG. 9 accommodates these and other types of temperature induced variations as represented in FIGS. 12A-12B. As before, FIG. 12A represents a programming operation at a first temperature (in this case, −10° C.) and FIG. 12B represents a subsequent read operation at a different, second temperature (in this case, +45° C.). FIG. 12A provides an I-V curve 180 for the cell in the initial erased state, a "standard" I-V curve 182 representing the target response, and an adjusted I-V curve 184 representing the response to which the cell is "overprogrammed" as a result of the lower than normal temperature using an increased voltage threshold 186. In this way, as shown by FIG. 12B, during the subsequent read operation at the higher temperature the response via I-V curve 188 may be closer to the target value.

Performing an access operation using the then-existing temperature of the memory cells and the temperature of the memory cells encountered during a previous access operation can provide enhanced accuracy in providing appropriate voltage thresholds. Knowing the temperature (or temperature range) of a previous access operation as well as the current temperature for a current access operation can enable the system to account for system non-linearities and other effects in selecting appropriate thresholds.

In some cases, temperature ranges may be established (e.g., COLD, WARM, HOT) and temperature measurement values may be categorized based on these temperature ranges. Table I provides a data structure that may be stored in suitable memory and accessed by the voltage threshold adjustment circuit 158 (FIG. 9) at appropriate times to determine suitable voltage thresholds based on the current temperature and a previous temperature of the associated memory cells:

TABLE 1

| PREVIOUS TEMP | CURRENT TEMP | | |
| --- | --- | --- | --- |
| | COLD | WARM | HOT |
| COLD | T-A(N) | T-B(N) | T-C(N) |
| WARM | T-D(N) | T-E(N) | T-F(N) |
| HOT | T-G(N) | T-H(N) | T-I(N) |

Each of the threshold sets T-A(N) through T-I(N) represent a different combination of voltage thresholds or other operational parameters (e.g., write verify thresholds, read thresholds, erasure thresholds, etc.). In one exemplary embodiment, COLD corresponds to a first range of temperatures below about +15° C., WARM corresponds to a second range of from about +16° C. to about +55° C., and HOT corresponds to a third range above about +56° C. Other ranges and numbers of ranges can be used.

From Table 1 it can be seen that the example sequence of FIGS. 12A-12B with a cold programming operation (−10° C.) and a warm read operation (+45° C.) would use the thresholds defined as T-B(N), and so on. It is contemplated that even if both the current access operation and the previous access operation both occurred in the same temperature range (e.g., both in the WARM range, etc.), adjustments may still be made to the voltage thresholds from baseline values depending on the characteristics of a given memory environment.

Other formulations can be used to determine the appropriate voltage thresholds, including mathematical formulae such as:

$$VA = (T1)K1 + (T2)K2 + K3 \qquad (1)$$

Where VA represents an adjustment in a baseline voltage threshold value (such as represented in FIG. 8), T1 is the previous temperature measurement value, T2 is the current temperature value, and K3 is a constant. In this case, the value VA may be added to, subtracted from, or otherwise combined with a baseline threshold value to arrive at the final value. Other formulations can be used, including second or other higher order equations, depending upon empirical analysis of the memory. Other factors can be incorporated into the formulation as well, such as aging, P/E counts, total writes/reads to adjacent cells, etc. so that the voltage threshold adjustment circuit 158 (FIG. 9) adjusts the final thresholds in view of these factors as well.

A calibration routine may be performed from time to time during the operational life of the memory to adjust the values set forth above (e.g., Table 1, equation (1), etc.). A counter may track operational life, so that after every X P/E counts (e.g., 5000, 10,000, 15,000, etc.) the storage device operates in the background to calibrate and adjust, as required, the respective adjustment values. The adjustment circuit 158 can be adaptive in that bit error rate (BER) or other performance characteristics can be monitored and used to adjust the thresholds under different operational conditions.

Figure 13:
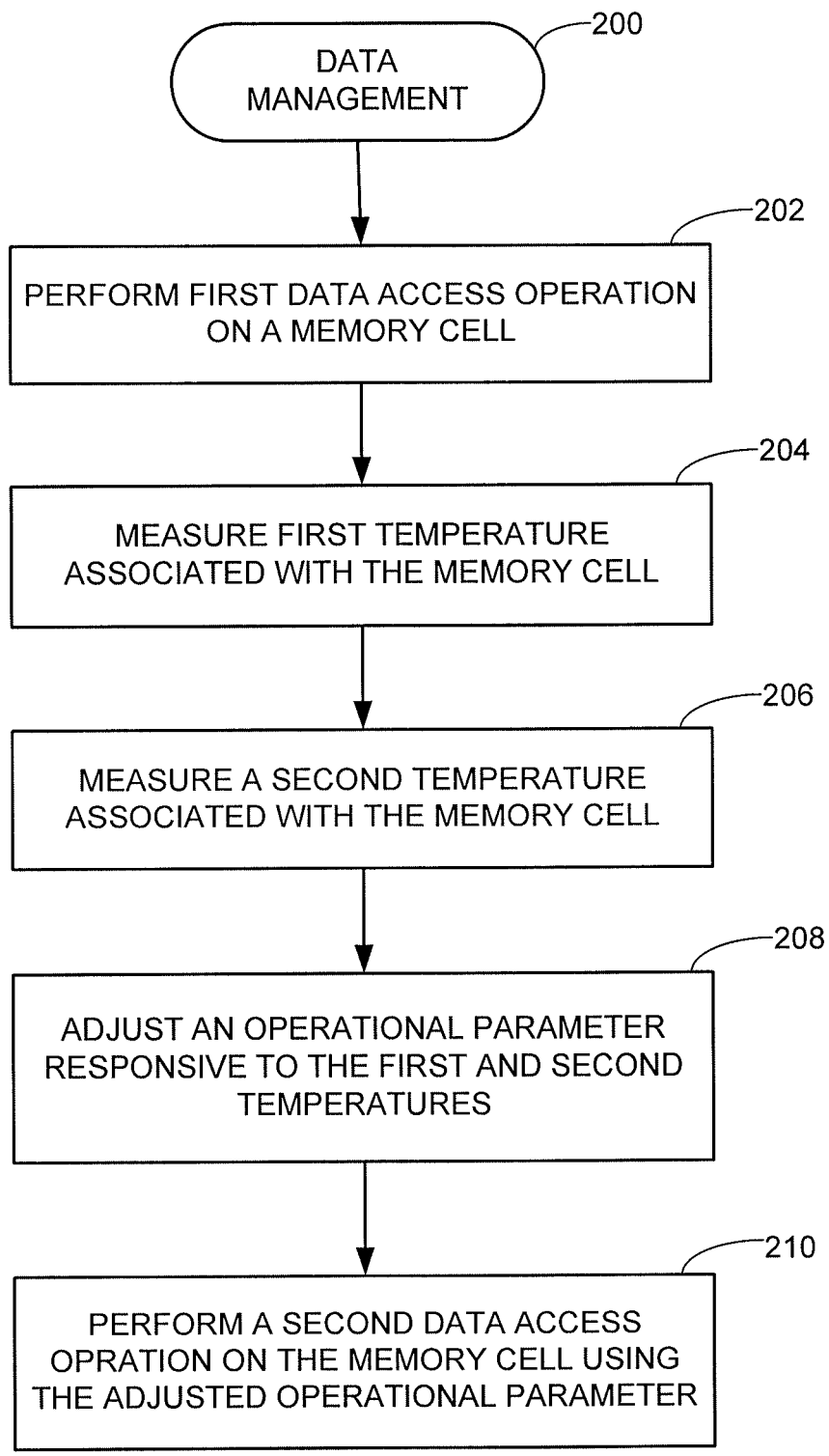
FIG. 13 is a flow chart for a DATA MANAGEMENT routine generally illustrative of steps carried out in accordance with some embodiments.

FIG. 13 provides a DATA MANAGEMENT routine 200, generally illustrative of steps that may be carried out in accordance with the various foregoing embodiments. The routine 200 may be carried out by any suitable circuitry, such as but not limited to a controller such as the controller 102 in FIG. 1 in conjunction with various operational modules such as those illustrated in FIG. 9. Alternatively, a memory module such as 104 in FIG. 1 may be provisioned with sufficient control capability to carry out these steps and report the various results as required.

A first data access operation is performed for a selected memory cell at step 202. For purposes of the present discussion, it will be contemplated that the selected memory cell is a selected erasure block 126 in the memory array 104, although other configurations can be used. The data access operation may be initiated by a host device. The data affected by the first data access operation may have an associated logical block address. Metadata associated with the stored data may further be generated and processed in a normal fashion.

A first temperature associated with the selected memory cell is determined at step 204. It is contemplated, albeit not necessarily required, that the first data access operation be initiated responsive to a host level command. A second temperature associated with the selected memory cell is determined at step 206. At step 208 an operational parameter responsive to the first and second temperatures associated with the selected memory cell is adjusted. A second data access operation is conducted on the memory cell using the adjusted operational threshold and step 210.

The various techniques disclosed herein may provide a number of benefits, including reduced power consumption, reduced wear, improved processing throughput and greater levels of data integrity. While the foregoing discussion has been focused primarily on the detection of a more accurate threshold voltage of memory cells for data access operations, it will be appreciated that this is merely exemplary and not limiting, as the foregoing techniques can be useful in a variety of different volatile and non-volatile memory locations.

It is to be understood that even though numerous characteristics and advantages of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A method comprising:
   accumulating a program/erase (P/E) count value indicative of a total number of P/E operations carried out on a memory cell;
   performing a first data access operation on the memory cell;
   measuring a first temperature associated with the first data access operation;
   subsequently measuring a second temperature associated with the memory cell;
   adjusting at least one operational parameter in response to the measured first and second temperatures and the accumulated P/E count value; and
   performing a second data access operation on the memory cell using the adjusted at least one operational parameter.

2. The method of claim 1 wherein the at least one operational parameter is further adjusted responsive to a measured bit error rate (BER) associated with the memory cell.

3. The method of claim 1 wherein the adjusting step comprises accessing a lookup table data structure in a memory that provides current and/or voltage values to be a applied to the memory cell during the performing of the second data access operation thereon based on the respective magnitudes of the first and second temperatures.

4. The method of claim 3 wherein the lookup table data structure defines X operational temperature ranges for each of the first and second temperatures where X is a plural number, wherein a total of $X^2$ different threshold value sets are stored by the lookup table data structure for each combination of the X temperature ranges, and wherein a selected threshold value set is identified based on a first temperature range of the X temperature ranges in which the first temperature falls and on a second temperature range of the X temperature ranges in which the second temperature falls.

5. The method of claim 1 wherein the adjusting step uses a predetermined threshold value set, and wherein the method further comprises performing a calibration operation to adjust the threshold value set responsive to the accumulated P/E count value reaching a selected threshold.

6. The method of claim 1 wherein each of the first and second data access operations is a write operation, a read operation or an erasure operation.

7. The method of claim 1 wherein the at least one operational parameter is a threshold voltage associated with the second data access operation.

8. The method of claim 1 further comprising accessing a lookup table data structure in a local memory to retrieve an adjustment value based on the first and second temperatures, and using the adjustment value to adjust the operational parameter.

9. The method of claim 1 further comprising generating a plurality of successive, non-overlapping operational temperature ranges, assigning the first temperature to a first range of said operational temperature ranges and the second temperature to a second range of said plurality of successive, non-overlapping operational temperature ranges, and adjusting the operational parameter responsive to the first range and to the second range.

10. A method comprising:
   programming a non-volatile memory cell to a selected programmed state;
   measuring a first temperature associated with the programming of the non-volatile memory cell and storing a corresponding first temperature value in a memory;
   subsequently measuring a second temperature value associated with the non-volatile memory cell responsive to a read command and storing a corresponding second temperature value in the memory; and
   performing a read operation responsive to the read command, the read operation comprising applying a read voltage threshold to the non-volatile memory cell having a magnitude selected in relation to the first and second temperature values, the read voltage threshold selected responsive to a total accumulated program/erase (P/E) count associated with the non-volatile memory cell.

11. The method of claim 10 wherein the first and second temperature associated with the memory cell is an ambient temperature of the memory cell.

12. The method of claim 10 wherein the first and second temperature associated with the memory cell is a temperature of a chip or substrate associated with the memory cell.

13. The method of claim 10 further comprising accessing a lookup table data structure in a local memory to retrieve an adjustment value based on the first and second temperatures, and using the adjustment value to derive the magnitude of the read voltage threshold.

14. The method of claim 10 further comprising defining a plurality of successive, non-overlapping operational temperature ranges, assigning the first temperature to a first range and the second temperature to a second range, and deriving the magnitude of the read voltage threshold responsive to the first temperature falling within the first range and the second temperature falling within the second range.

15. An apparatus comprising:
   a memory comprising a plurality of memory cells; and
   a control circuit adapted to perform a first data access operation on a memory cell, measure a first temperature associated with the memory cell in the memory, measure a second temperature associated with the memory cell, adjust at least one operational parameter responsive to the first and second temperatures associated with the memory cell, and perform a second data access operation on the memory cell using the adjusted at least one operational parameter and an accumulated program/erase (P/E) count indicative of a total number of P/E operations applied to the memory cell.

16. The apparatus of claim 15 wherein the first data access operation is a programming operation to program a flash memory cell to a selected programmed state and the second data access operation is a read operation to subsequently read the selected programmed state of the flash memory cell.

17. The apparatus of claim 15 further comprising a temperature sensor which measures the first and second temperatures.

18. The apparatus of claim 15 wherein the adjusted operational parameter is a voltage threshold applied to a gate structure of a flash memory cell.

19. The apparatus of claim 15 wherein the first and second data access operations are each characterized as a write operation, read operation or an erasure operation.

20. The apparatus of claim 15 wherein the at least one operational parameter is a threshold voltage associated with the second data access operation.

* * * * *